(12) United States Patent
Sakai et al.

(10) Patent No.: US 7,793,413 B2
(45) Date of Patent: Sep. 14, 2010

(54) METHOD OF MOUNTING ELECTRONIC COMPONENTS

(75) Inventors: Tadahiko Sakai, Fukuoka (JP); Hideki Eifuku, Fukuoka (JP)

(73) Assignee: Panasonic Corporation, Osaka (JP)

( * ) Notice: Subject to any disclaimer, the term of this patent is extended or adjusted under 35 U.S.C. 154(b) by 194 days.

(21) Appl. No.: 11/816,177

(22) PCT Filed: Sep. 22, 2006

(86) PCT No.: PCT/JP2006/319403

§ 371 (c)(1),
(2), (4) Date: Aug. 14, 2007

(87) PCT Pub. No.: WO2007/043355

PCT Pub. Date: Apr. 19, 2007

(65) Prior Publication Data

US 2009/0205203 A1 Aug. 20, 2009

(30) Foreign Application Priority Data

Sep. 30, 2005 (JP) ............................. 2005-288107

(51) Int. Cl.
*H05K 3/34* (2006.01)
*H05K 1/16* (2006.01)
(52) U.S. Cl. ................ 29/840; 29/832; 29/846; 174/260; 257/758; 438/108
(58) Field of Classification Search ............. 29/832, 29/840, 846; 174/260; 257/758; 438/108
See application file for complete search history.

(56) References Cited

U.S. PATENT DOCUMENTS 5,819,406 A * 10/1998 Yoshizawa et al. ............ 29/877
6,000,127 A * 12/1999 Eifuku et al. .................. 29/840

(Continued)

FOREIGN PATENT DOCUMENTS

CN         1298626 A         6/2001

(Continued)

OTHER PUBLICATIONS

Chinese Office Action.

*Primary Examiner*—C. J Arbes
(74) *Attorney, Agent, or Firm*—Pearne & Gordon LLP

(57) ABSTRACT

An electronic component mounting method for mounting a electronic component on a board, in which an Au bump provided at an electronic component is joined to a joining terminal formed on a board by using solder made of Sn or solder containing Sn and the electronic component is adhered to the board by means of thermosetting resin thereby to mount the electronic component on the board. The applied thermosetting resin is flown toward the outside by the lower surface of the electronic component, then a part of the solder particles contained within the thermosetting resin are made in contact with the side surfaces of the Au bumps which are heated to the temperature higher than the melting point of the solder and also another part of the solder particles are molten in a state of being sandwiched between the Au bumps and the electrodes. Thus, the diffusion of Sn into the Au bumps from the outside is promoted and so the density of Sn within the Au bumps can be increased. Further, the diffusion of Sn into the Au bump from a solder joining portion can be suppressed and so the generation of Kirkendall voids can be suppressed.

4 Claims, 3 Drawing Sheets

U.S. PATENT DOCUMENTS

| | | |
|---|---|---|
| 6,108,210 A | 8/2000 | Chung |
| 6,335,563 B1 * | 1/2002 | Hashimoto .................. 257/632 |
| 6,368,895 B1 * | 4/2002 | Hori .......................... 438/108 |
| 6,524,943 B1 * | 2/2003 | Sakuyama ................. 438/613 |
| 6,621,172 B2 * | 9/2003 | Nakayama et al. .......... 257/787 |
| 6,670,264 B2 * | 12/2003 | Sakuyama et al. ......... 438/610 |
| 6,796,025 B2 * | 9/2004 | Imamura et al. ............. 29/840 |
| 6,846,699 B2 | 1/2005 | Sakurai |
| 7,186,925 B2 * | 3/2007 | Tsukahara et al. .......... 174/260 |
| 7,191,515 B2 * | 3/2007 | Sundahl et al. .............. 29/830 |
| 2004/0200065 A1 * | 10/2004 | Tsukahara et al. ........... 29/832 |
| 2008/0135283 A1 * | 6/2008 | Hibino et al. ............... 174/260 |

FOREIGN PATENT DOCUMENTS

| | | |
|---|---|---|
| EP | 1223612 | 7/2002 |
| JP | 08-186156 | 7/1996 |
| JP | 10-112473 | 4/1998 |
| JP | 11-004064 | 1/1999 |
| JP | 11-004064 A | 1/1999 |
| JP | 11-176879 | 7/1999 |
| JP | 11-176879 A | 7/1999 |
| JP | 2002-198395 A | 7/2002 |
| JP | 2003-017531 A | 1/2003 |
| WO | 99/56509 | 11/1999 |

* cited by examiner

METHOD OF MOUNTING ELECTRONIC COMPONENTS

TECHNICAL FIELD

The present invention relates to an electronic component mounting method of mounting electronic components each provided with gold (Au) bumps on a board.

BACKGROUND ART

As a method of mounting electronic components on a board, one mode has been employed widely in which bumps provided at the electronic component are joined to joining terminals formed on the board, respectively. Au, which is excellent in conductivity and never subjected to the surface deterioration due to oxidization, is widely used as the material of the bumps. As a method of joining bumps made of Au to joining terminals, there has been known a method using anisotropic conductive material which is formed by mixing conductive particles into thermosetting resin. In this method, the anisotropic conductive material is applied in advance on the board so as to cover the joining terminals prior to the mounting of the electronic components, and then the bumps are heated while being pressed against the joining terminals at the time of mounting the electronic components. Thus, the bumps and the joining terminals are electrically made conductive therebetween via the conductive particles and further the main bodies of the electronic components are joined with the board by the hardened anisotropic conductive material.

This method of using the anisotropic conductive material has an advantage that both the electrical conductivity and the joining of the main bodies of the electronic components to the board can be performed simultaneously. However, in order to secure good conductivity and realize a low coupling resistance, this method is required to keep the contacting state between the bump and the joining terminal uniform as to all of the bumps. To this end, the part mounting method using the anisotropic conductive material requires a mounting equipment with a high mounting accuracy. Thus, there has been required a method which can mount electronic components each provided with Au bumps easily and with a high quality.

Therefore, in order to satisfy such a requirement, various methods have been proposed in each of which the conductive particles contained in the anisotropic conductive material is replaced by solder particles (see patent documents 1 to 4, for example). In each example of these patent documents, a sheet-shaped anisotropic conductive material formed by mixing the solder particles in resin is used, and at the time of mounting electronic components, the solder resin disposed between bumps and joining terminals are molten thereby to secure good conductivity.

[Patent Document 1] JP-A-8-186156
[Patent Document 2] JP-A-10-112473
[Patent Document 3] JP-A-11-4064
[Patent Document 4] JP-A-11-176879

However, in the method shown in each of the aforesaid examples, when Su solder having been widely used in recent years as the solder material constituting the solder particles is employed, there arises a problem that the intensity is degraded due to Kirkendall voids as explained below. That is, in an area near the joining boundary where the bump made of Au and the joining terminal are joined via the solder, the diffusion of Sn into Au proceeds with the lapse of time. In this case, in the solder joining using the anisotropic conductive material, since an amount of the solder particles contained in the anisotropic conductive material is smaller as compared with that used in the usual solder joining, the difference of density of Sn likely becomes large between the solder joining portion and the bump. As a result, the diffusion of Sn from the solder joining portion into the bump is promoted. Accordingly, fine voids occurs at portions of the solder joining portion where Sn diffuses into Au, which causes the large degradation of the joining intensity.

DISCLOSURE OF INVENTION

Accordingly, an object of the invention is to provide, in an electronic component mounting method of joining bumps of Au by using solder, an electronic component mounting method which can prevent the occurrence of degradation of intensity due to the Kirkendall voids.

An electronic component mounting method according to the invention is arranged in a manner that in the electronic component mounting method in which an Au bump provided at an electronic component is joined to a joining terminal formed on a board by using solder made of Sn or solder containing Sn and the electronic component is adhered to the board by means of thermosetting resin thereby to mount, the electronic component on the board, the method includes:

a resin application process of applying thermosetting resin, which contains solder particles that are formed by particulating the solder, on a region containing the joining terminal on the surface of the board;

a positioning process of performing positioning between the Au bump and the joining terminal in a state that the electronic component is held by a holding head having a heating function;

a bump joining process of lowering the holding head while heating the electronic component by the holding head thereby to join the Au bump to the joining terminal; and a resin hardening process of thermally curing the thermosetting resin thereby to adhere the electronic component on the board, wherein in the bump joining process, the applied thermosetting resin is flown toward the outside by the lower surface of the electronic component, the solder particles contained in the thermosetting resin are made in contact by the holding head with the side surface of the Au bump heated to a temperature higher than the melting point, of the solder, and a part of the solder particles are molten in a state of being sandwiched between the Au bump and the joining terminal.

According to the invention, the applied thermosetting resin is flown toward the outside by the lower surface of the electronic component, then a part of the solder particles contained within the thermosetting resin are made in contact with the side surfaces of the Au bumps which are heated to the temperature higher than the melting point of the solder and also another part of the solder particles are molten in a state of being sandwiched between the Au bumps and the electrodes. Thus, the diffusion of Sn into the Au bumps from the outside is promoted and so the density of Sn within the Au bumps can be increased. Further, the diffusion of Sn into the Au bump from a solder joining portion can be suppressed and so the generation of Kirkendall voids can be suppressed.

BEST MODE FOR CARRYING OUT THE INVENTION

An embodiment of the invention will be explained with reference to the drawings. According to this electronic component mounting method, Au bumps provided at an electronic component are joined to joining terminals formed on a board by using Sn solder or solder containing Sn, respectively, and the electronic component is adhered to the board by mean of thermosetting resin.

Figure 1A:
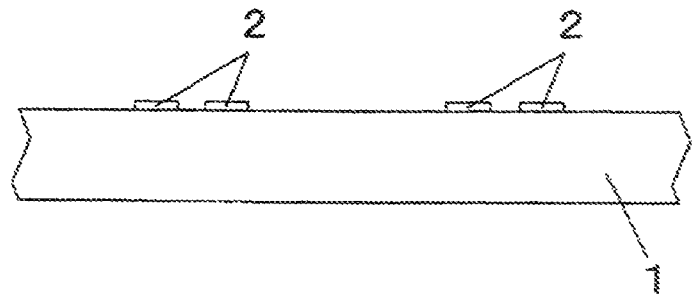
FIGS. 1(a) to 1(c) are diagrams for explaining an electronic component mounting method according to an embodiment of the invention.
Figure 1B:
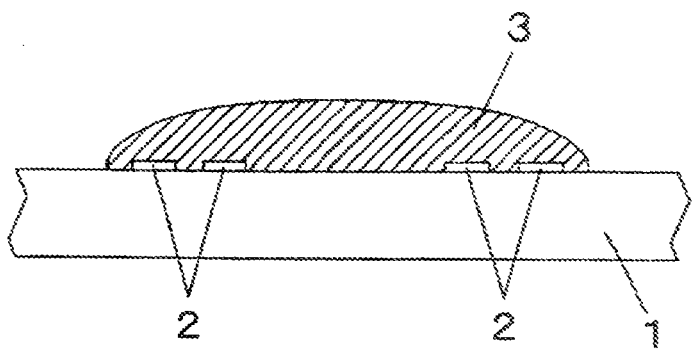

In FIG. 1(a), electrodes 2 each serving as a joining terminal are formed on the surface of the board 1. As shown in FIG. 1(b), thermosetting resin 3 containing solder particles (see solder particles 4 shown in FIG. 3(a)) formed by particulating solder is applied on a region containing the electrodes 2 at the surface of the board 1 (a resin application process). The solder used for the solder particles 4 is Sn—Ag-basis solder containing Sn and Ag, Sn—Ag—Cu-basis solder containing Sn, Ag and Cu, or Sn—Bi-basis solder containing Sn and Bi.

Figure 1C:
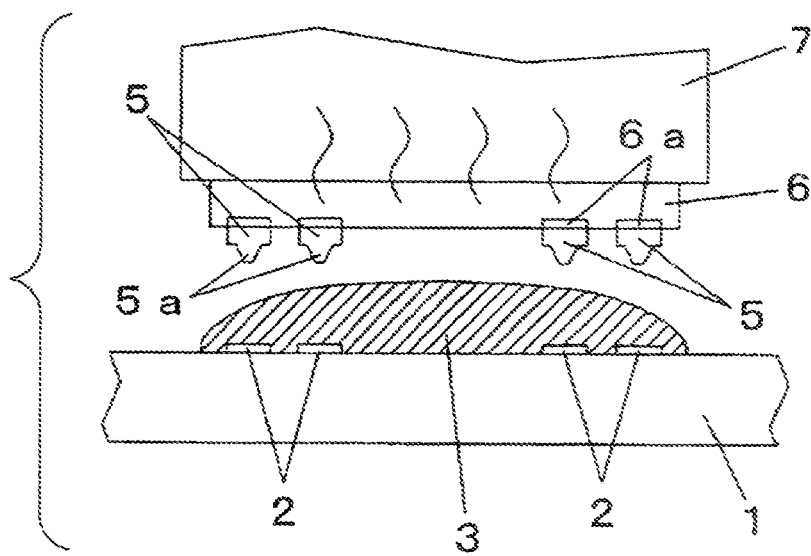

Next, an electronic component 6 is mounted on the board 1 on which the resin has been applied. As shown in FIG. 1(c), each of electrodes 6a formed on the lower surface of the electronic component 6 is provided with an Au bump 5 having a convex portion 5a at the lower portion thereof. The electronic component 6 is sucked and held by a holding head 7 which has a heating function. The heating of the electronic component 6 is started prior to the mounting on the board 1. The holding head 7 thus holding the electronic component 6 moves above the board 1 while heating the electronic component 6 and performs the positioning between the Au bumps 5 and the electrodes 2, respectively (a positioning process).

Figure 2:
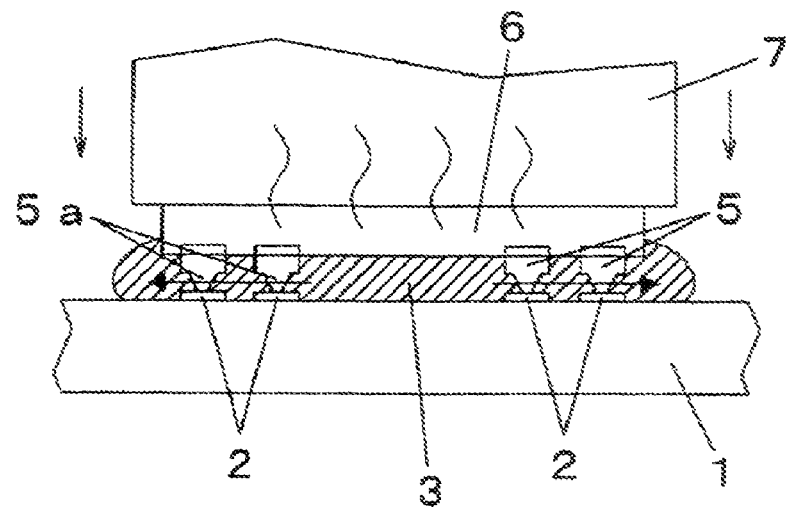
FIGS. 2(a) and 2(b) are diagrams for explaining the electronic component mounting method according to the embodiment of the invention.
Figure 2:
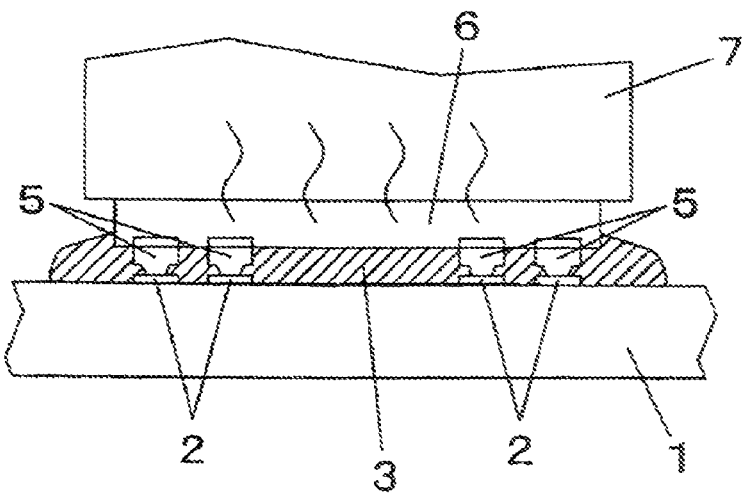

Thereafter, the heating of the electronic component 6 is proceeded and when the temperature of the Au bumps 5 becomes higher than the melting point of the solder particles 4 contained in the thermosetting resin 3, the placing operation of the electronic component 6 is started. That is, the holding head 7 is lowered thereby to join the Au bumps 5 to the electrodes 2, respectively, while the holding head 7 heats the electronic component 6 (a bump joining process). In this case, at first, as shown in FIG. 2(a), according to the lowering of the electronic component 6, the convex portions 5a of the Au bumps 5 are placed on the electrodes 2, respectively, while extending the thermosetting resin 3 applied on the surface of the board 1 toward the outside by force. Then, the holding head 7 continues to press and heat the electronic component 6, whereby, as shown in FIG. 2(b), the Au bumps 5 are joined to the electrodes 2 respectively in a state that the convex portions 5a are slightly deformed. Simultaneously, the thermosetting resin 3 is thermally cured thereby to fix the electronic component 6 on the board 1 (a resin hardening process).

Figure 3:
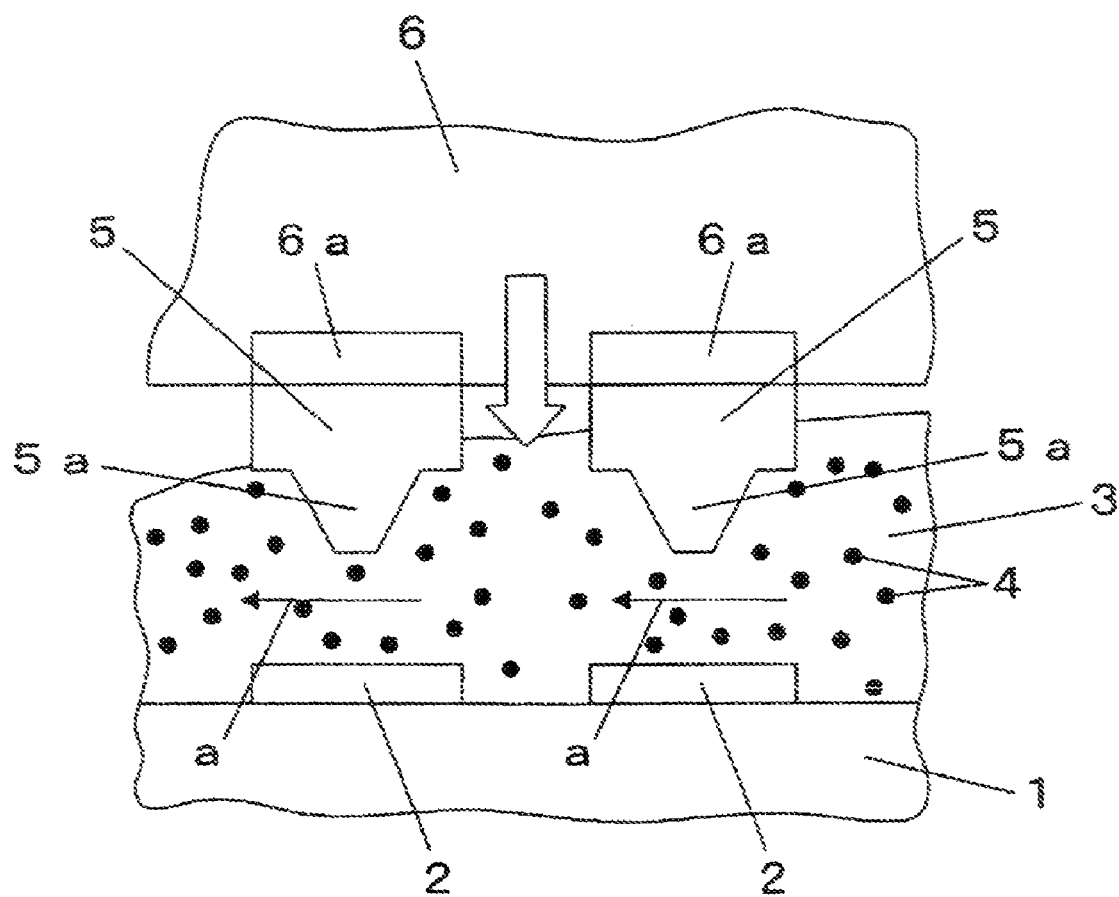
FIGS. 3(a) and 3(b) are diagrams for explaining the electronic component mounting method according to the embodiment of the invention.
Figure 3:
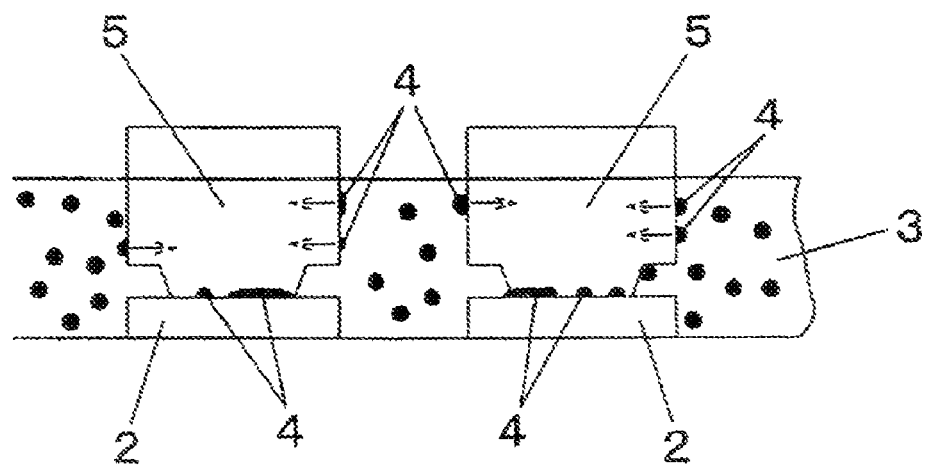

FIGS. 3(a) and 3(b) show the behavior of the thermosetting resin 3 in the aforesaid bump joining process. In the process of lowering the electronic component 6 with respect to the board 1, firstly the convex portions 5a of the Au bumps 5 are buried within the thermosetting resin 3 and then the lower surface of the electronic component 6 pushes the thermosetting resin 3 down. Thus, the thermosetting resin 3 is extended by force toward the outside from the inside, whereby the thermosetting resin 3 flows outside (a direction shown by an arrow a) together with the solder particles 4 contained therein.

When the electronic component 6 is further lowered in this state, as shown in FIG. 2(b), a part of the solder particles 4 within the thermosetting resin 3 contact to the side surfaces of the Au bumps 5 and another part of the solder particles are sandwiched between the lower surfaces of the Au bumps 5 and the electrodes 2. These part and another part of the solder particles 4 melt since they contact to the Au bumps 5 having been heated to the temperature higher than the melting point of the solder particles 4 in advance. In this case, Sn constituting the solder particles 4 diffuses into Au of the Au bumps 5 from the solder particles 4 that contact to the side surfaces of the Au bumps 5 and are thus molten. The solder particles 4 molten between the Au bumps 5 and the electrodes 2 are cooled and solidified later and so serve to join the Au bumps 5 to the electrodes 2, respectively.

In other words, according to the electronic component mounting method of the embodiment, the applied thermosetting resin 3 is flown outside by the lower surface of the electronic component 6, then the part of the solder particles 4 contained within the thermosetting resin 3 are made in contact with the side surfaces of the Au bumps 5 which are heated to the temperature higher than the melting point of the solder by the holding head 7 and also the another part of the solder particles 4 are molten in the state of being sandwiched between the Au bumps 5 and the electrodes 2.

When the aforesaid electronic component mounting method is employed at the time of joining the Au bumps 5 to the electrodes 2 by using the solder containing Sn, the following excellent technical effects can be obtained. That is, in the case of using the solder containing Sn in order to join the electronic components 6 to the electrodes 2, there arises a problem that the intensity is degraded due to the Kirkendall voids. Concretely, in an area near the joining boundary where the bump made of Au and the electrode are joined via the solder, the diffusion of Sn from the solder joining portion into Au likely generates fine voids, which causes the degradation of the joining intensity.

In contrast, according to the electronic component mounting method of the embodiment, the solder particles 4 within the thermosetting resin 3 are flown and made in contact with the side surfaces of the heated Au bumps 5 thereby to melt these solder particles 4 on the surface of the Au bumps 5. Thus, Sn within the solder particles 4 diffuses into the Au bump 5 from the outer portion toward the inner portion thereof and so the density of Sn within the Au bumps 5 increases. This means that a difference between the density of Sn within the Au bump 5 and the density of Sn near the joining boundary between the Au bump 5 and the electrode 2 reduces.

Thus, the diffusion of Sn into the Au bump 5 from the solder particles 4 existing at the joining boundary between the Au bump 5 and the electrode 2 can be suppressed, whereby the degradation of the joining intensity due to the generation of the Kirkendall voids caused by the diffusion of Sn can be suppressed. In this case, since the Au bumps 5 are heated to the temperature higher than the melting point of the solder particles 4 before the Au bumps 5 are made in contact with the thermosetting resin 3, the solder particles 4 made in contact with the Au bumps 5 are quickly molten and so the diffusion of Sn into the Au bumps 5 from the outside thereof can be promoted.

This application is based upon and claims the benefit of priority of Japanese Patent Application No. 2005-288107 filed on Sep. 30, 2005, the contents of which are incorporated herein by reference in its entirety.

INDUSTRIAL APPLICABILITY

The electronic component mounting method according to the invention has the effect that the generation of the Kirkendall voids can be suppressed while also suppressing the diffusion of Sn into the Au bumps from the solder joining portion and so can be applied to a usage in which Au bumps are joined to joining terminals formed on a board, respectively, by using solder made of Sn or solder containing Sn.

The invention claimed is:

1. An electronic component mounting method for mounting an electronic component on a board, in which an Au bump provided at an electronic component is joined to a joining terminal formed on a board by using solder made of Sn or solder containing Sn and the electronic component is adhered to the board by means of thermosetting resin thereby to mount the electronic component on the board, comprising:
   a resin application process of applying thermosetting resin, which contains Sn-containing solder particles that are formed by particulating the solder, on a region containing the joining terminal on a surface of the board;
   a positioning process of performing positioning between the Au bump and the joining terminal in a state that the electronic component is held by a holding head having a heating function;
   a bump joining process of lowering the holding head while heating the electronic component by the holding head thereby to join the Au bump to the joining terminal; and
   a resin hardening process of thermally curing the thermosetting resin thereby to adhere the electronic component on the board,
   wherein in the bump joining process, the applied thermosetting resin is pushed down by a lower surface of the electronic component to flow outside, the solder particles contained in the thermosetting resin are made in contact by the holding head with a side surface of the Au bump heated to a temperature higher than a melting point of the solder, and a part of the solder particles are molten in a state of being sandwiched between the Au bump and the joining terminal.

2. An electronic component mounting method according to claim 1, wherein the solder is Sn—Ag solder containing Sn and Ag, Sn—Ag—Cu solder containing Sn, Ag and Cu, or Sn—Bi solder containing Sn and Bi.

3. An electronic component mounting method according to claim 1, wherein the Au bump is heated to a temperature higher than the melting point of the solder before the Au bump is made in contact with the thermosetting resin.

4. An electronic component mounting method according to claim 2, wherein the Au bump is heated to a temperature higher than the melting point of the solder before the Au bump is made in contact with the thermosetting resin.

* * * * *